US011462646B2

(12) United States Patent
Abe et al.

(10) Patent No.: US 11,462,646 B2
(45) Date of Patent: Oct. 4, 2022

(54) FIELD-EFFECT TRANSISTOR, DISPLAY ELEMENT, IMAGE DISPLAY DEVICE, AND SYSTEM

(71) Applicant: Ricoh Company, Ltd., Tokyo (JP)

(72) Inventors: Yukiko Abe, Kanagawa (JP); Yuichi Ando, Hyogo (JP); Yuki Nakamura, Tokyo (JP); Shinji Matsumoto, Kanagawa (JP); Yuji Sone, Kanagawa (JP); Naoyuki Ueda, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 225 days.

(21) Appl. No.: 16/822,858

(22) Filed: Mar. 18, 2020

(65) Prior Publication Data
US 2020/0303561 A1    Sep. 24, 2020

(30) Foreign Application Priority Data
Mar. 20, 2019 (JP) .............................. JP2019-053473

(51) Int. Cl.
*H01L 29/786* (2006.01)
*H01L 27/12* (2006.01)
(Continued)

(52) U.S. Cl.
CPC ......... *H01L 29/78693* (2013.01); *G09G 3/30* (2013.01); *G09G 3/36* (2013.01);
(Continued)

(58) Field of Classification Search
CPC ...... G09G 3/30; G09G 3/3233; G09G 3/3648; G09G 3/3225; G09G 3/006;
(Continued)

(56) References Cited

U.S. PATENT DOCUMENTS 8,268,666 B2    9/2012  Abe et al.
9,105,473 B2    8/2015  Ueda et al.
(Continued)

FOREIGN PATENT DOCUMENTS

EP    3236503 A1    10/2017
JP    2011-192971    9/2011
(Continued)

OTHER PUBLICATIONS

K. Nomura, 5 others, "Room-temperature fabrication of transparent flexible thin-film transistors using amorphous oxide semiconductors", Nature, vol. 432, Nov. 25, 2004, pp. 488-492.

*Primary Examiner* — Mouloucoulaye Inoussa
(74) *Attorney, Agent, or Firm* — Xsensus LLP

(57) ABSTRACT

A field-effect transistor including a semiconductor layer formed of an n-type metal oxide semiconductor, wherein the n-type metal oxide semiconductor includes indium oxide, wherein the indium oxide is n-type doped through introduction of one or more kinds of cations as dopants, and wherein the n-type metal oxide semiconductor has a peak detected at an angle corresponding to a (222) plane of indium oxide having a bixbite structure in an X-ray diffraction method using a two-dimensional detector.

8 Claims, 13 Drawing Sheets

(51) Int. Cl.
*H01L 29/24* (2006.01)
*G09G 3/30* (2006.01)
*G09G 3/36* (2006.01)
*G02B 26/00* (2006.01)
*G02F 1/133* (2006.01)
*G02F 1/163* (2006.01)
*G02F 1/167* (2019.01)
*G02F 1/1685* (2019.01)
*H01L 27/32* (2006.01)

(52) U.S. Cl.
CPC ........ *H01L 27/1225* (2013.01); *H01L 29/247* (2013.01); *G02B 26/005* (2013.01); *G02F 1/13306* (2013.01); *G02F 1/163* (2013.01); *G02F 1/167* (2013.01); *G02F 1/1685* (2019.01); *H01L 27/3262* (2013.01)

(58) Field of Classification Search
CPC ........... H01L 27/1225; H01L 29/78693; H01L 29/66969; H01L 29/7869; H01L 29/247; H01L 27/3262; H01L 29/78696; H01L 27/11514; H01L 27/11551; H01L 27/1158; H01L 27/11558; H01L 27/11553; H01L 27/11556; H01L 27/11597; H01L 27/1156; H01L 27/249; H01L 27/11582; H01L 27/2481; H01L 27/124; H01L 29/517; H01L 29/4908; H01L 29/24; H01L 29/78609; G02B 27/026; G02B 26/005; G02F 1/167; G02F 1/13306; G02F 1/163; G02F 1/1685; G02F 1/1368
USPC .................. 257/40, 43, 66, 59, 57, E29.292, 257/E21.114, E29.08, E29.296, E33.053; 423/594.9, 594.7; 349/42; 252/520.1, 252/518.1, 519.12; 438/104, 478, 46
See application file for complete search history.

(56) References Cited

U.S. PATENT DOCUMENTS

| | | | |
|---|---|---|---|
| 9,112,039 | B2 | 8/2015 | Ueda et al. |
| 9,418,842 | B2 | 8/2016 | Nakamura et al. |
| 9,748,097 | B2 | 8/2017 | Nakamura et al. |
| 9,978,877 | B2 | 5/2018 | Matsumoto et al. |
| 10,115,828 | B2 | 10/2018 | Abe et al. |
| 10,170,635 | B2 | 1/2019 | Matsumoto et al. |
| 10,204,799 | B2 | 2/2019 | Kusayanagi et al. |
| 10,312,373 | B2 | 6/2019 | Arae et al. |
| 2009/0206341 | A1* | 8/2009 | Marks ............... H01L 29/78681 257/66 |
| 2010/0295042 | A1* | 11/2010 | Yano .................. H01L 29/7869 257/43 |
| 2012/0306834 | A1 | 12/2012 | Ueda et al. |
| 2013/0248852 | A1* | 9/2013 | Yokozeki ........... H01L 21/0237 257/43 |
| 2015/0287830 | A1* | 10/2015 | Nakayama ........ H01L 21/02488 257/43 |
| 2016/0013215 | A1 | 1/2016 | Ueda et al. |
| 2016/0190329 | A1 | 6/2016 | Matsumoto et al. |
| 2017/0033237 | A1* | 2/2017 | Abe ..................... G09G 3/3225 |
| 2017/0154998 | A1 | 6/2017 | Ueda et al. |
| 2017/0162601 | A1 | 6/2017 | Arae et al. |
| 2017/0162704 | A1 | 6/2017 | Abe et al. |
| 2019/0027608 | A1 | 1/2019 | Matsumoto et al. |
| 2019/0051752 | A1 | 2/2019 | Ueda et al. |
| 2019/0245090 | A1 | 8/2019 | Kusayanagi et al. |
| 2019/0393353 | A1* | 12/2019 | Jeong ............... H01L 29/66969 |

FOREIGN PATENT DOCUMENTS

| | | |
|---|---|---|
| JP | 2016-029719 | 3/2016 |
| JP | 2017-195355 | 10/2017 |
| JP | 2017-208532 | 11/2017 |

\* cited by examiner

FIELD-EFFECT TRANSISTOR, DISPLAY ELEMENT, IMAGE DISPLAY DEVICE, AND SYSTEM

CROSS-REFERENCE TO RELATED APPLICATIONS

The present application claims priority under 35 U.S.C. § 119 to Japanese Patent Application No. 2019-053473, filed Mar. 20, 2019. The contents of which are incorporated herein by reference in their entirety.

BACKGROUND OF THE INVENTION

Field of the Invention

The present disclosure relates to a field-effect transistor, a display element, an image display device, and a system.

Description of the Related Art

Liquid crystal displays (LCDs), organic electroluminescence (EL) displays (OLEDs), and flat panel displays (FPDs) such as electronic paper are driven by driving circuits including thin-film transistors (TFTs) that use amorphous silicon or polycrystalline silicon in active layers thereof. FPDs have further been demanded to be larger in size, higher in definition, and faster in driving properties. This tendency demands TFTs having higher carrier mobility and more stable properties.

However, there are both advantages and disadvantages in TFTs using an active layer including amorphous silicon (a-Si) or polycrystalline silicon (in particular, low-temperature poly silicon (LTPS)). It has been difficult for the TFTs to meet all of the demands at the same time.

K. Nomura, 5 others "Room-temperature fabrication of transparent flexible thin-film transistors using amorphous oxide semiconductors", NATURE, VOL432, No. 25, November, 2004, pp. 488-492 proposes $InGaZnO_4$ (a-IGZO) that is capable of being formed into a film at room temperature and exhibits mobility in an amorphous state which is equal to or higher than the mobility of a-Si. This is a trigger of extensive studies on amorphous oxide semiconductors exhibiting high mobility.

There is, however, a limit to increasing the mobility of a-IGZO since it is amorphous. The carrier density of a-IGZO depends on the amount of oxygen vacancy in a film. Due to this amount of oxygen vacancy that is easily changeable, TFTs having a-IGZO as the active layer have low stability, which is problematic.

Japanese Unexamined Patent Application Publication No. 2011-192971 discloses a TFT including an active layer using a metal oxide semiconductor that is an n-type doped crystalline compound. This publication, however, does not present conditions for effectively performing n-type doping or conditions for obtaining high mobility.

SUMMARY OF THE INVENTION

According to one aspect of the present disclosure, a field-effect transistor includes a semiconductor layer formed of an n-type metal oxide semiconductor. The n-type metal oxide semiconductor includes indium oxide. The indium oxide is n-type doped through introduction of one or more kinds of cations as dopants. The n-type metal oxide semiconductor has a peak detected at an angle corresponding to a (222) plane of indium oxide having a bixbite structure in an X-ray diffraction method using a two-dimensional detector.

DESCRIPTION OF THE EMBODIMENTS

Figure 1:
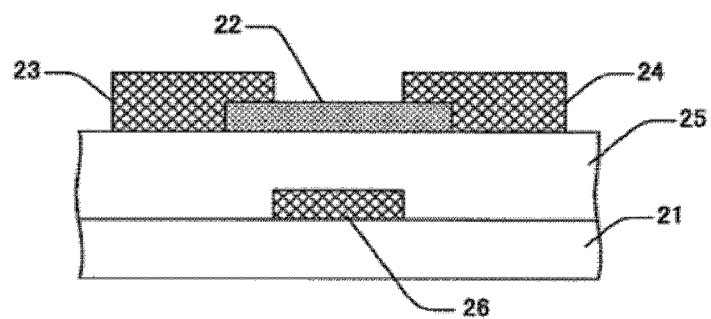
FIG. 1 is a schematic view of one example of a top contact/bottom gate field-effect transistor.

Before embodiments of the present invention are described, techniques related to the present invention will be described.

There is a limit to increasing the mobility of TFTs having an active layer of a-IGZO since the active layer is amorphous. In a-IGZO, carrier electrons are generated from oxygen vacancies, and thus its characteristics are easily changeable; i.e., unstable since they are influenced by oxygen in the atmosphere or in an adjacent layer to the active layer. The carrier electron density decreases, for example, when oxygen in the atmosphere or in the adjacent layer is taken into the active layer. Conversely, the carrier electron density increases when oxygen is taken out from the active layer. TFT characteristics change depending on an increase or decrease in the carrier density and thus operations of TFTs using such oxide semiconductors for active layers are unstable.

A disclosed existing technique for increasing TFT stability by preventing changes in the characteristics of an active layer is converting an oxide semiconductor of the active layer to be of I-type (intrinsic) (Japanese Unexamined Patent Application Publication No. 2011-129895). In this technique, impurities in oxide semiconductors that are sources of carrier generation are removed and oxygen is supplied to minimize oxygen vacancies, and the carrier concentration in the active layer is set to be less than $1\times10^{14}/cm^3$, preferably less than $1\times10^{12}/cm^3$, more preferably $1\times10^{11}/cm^3$ or less, to thereby increase reliability. TFTs having an active layer of an oxide with an extremely low carrier concentration cannot exhibit high mobility.

Japanese Unexamined Patent Application Publication No. 2011-192971 discloses a TFT having an active layer using a metal oxide semiconductor that is an n-type doped crystalline compound. This publication describes about the state of the active layer that it is necessary for local structures to be retained in order to establish n-type substitutional doping, and it is preferable that short-range and medium-range structures be retained even when it appears to be amorphous in X-ray diffraction. It is, however, unclear what state is specifically indicated, and this publication does not present conditions for effectively performing n-type doping or conditions for obtaining high mobility.

Accordingly, there is a demand for a TFT exhibiting high mobility and having stability increased by n-type doping effectively working.

The present disclosure provides an invention that meets this demand.

An object of the present disclosure is to provide a field-effect transistor exhibiting high mobility and high stability.

According to the present disclosure, it is possible to provide a field-effect transistor exhibiting high mobility and high stability.

(Field-Effect Transistor)

A field-effect transistor of the present disclosure includes a semiconductor layer formed of an n-type metal oxide semiconductor and if necessary further includes a gate electrode, a source electrode, a drain electrode, a gate insulating film, and other components.

<Semiconductor Layer (Active Layer)>

The semiconductor layer (active layer) is, for example, a layer provided to be adjacent to the source electrode and the drain electrode.

In the field-effect transistor of the present disclosure, the n-type metal oxide semiconductor forming the semiconductor layer contains indium oxide, and the indium oxide is n-type doped through introduction of one or more kinds of cations as dopants. This n-type metal oxide semiconductor has a peak detected at an angle corresponding to a (222) plane of indium oxide having a bixbite structure in an X-ray diffraction method using a two-dimensional detector.

In this substitution-doped n-type metal oxide semiconductor, some of the indium sites of the indium oxide that is the mother phase are replaced with ions of dopants having a higher valence. Excessive electrons released due to the difference in valances serve as carriers of n-type conduction. When the carrier electrons generated by such substitutional doping are responsible for semiconductor properties, the resultant properties become more stable. This is because the number of carrier electrons derived from oxygen vacancy easily changes by influences of, for example, oxidation/reduction reactions and oxygen adsorption onto the film surface due to the exchange of oxygen between the semiconductor and the outside (the atmosphere and adjacent layers) whereas the number of carrier electrons derived from substitutional doping is relatively unaffected by such state changes.

Regarding substitutional doping, it is known that even if substitutional doping is performed when the amorphous nature of an oxide semiconductor serving as the mother phase is high, the resultant structure changes to be in a locally stable state, so that no carrier is generated. The present inventors performed X-ray diffraction measurement on the n-type metal oxide semiconductor, but did not obtain any information on its crystallinity or amorphous nature. This is because a suitable film thickness of the n-type metal oxide semiconductor as the active layer of TFT is small; i.e., 30 nm or less in many cases, so that no peak can be observed in X-ray diffraction even in the crystalline state. As a result of the studies by the present inventors, it has been found that crystallinity can be assessed by an X-ray diffraction method using a two-dimensional detector, and when a peak is detected at an angle corresponding to a (222) plane of indium oxide having a bixbite structure, a preferable state is achieved where carriers are generated by substitutional doping effectively working.

Here, unlike a zero-dimensional detector usually used in an X-ray diffraction method, the two-dimensional detector can obtain data in a wide range of a reciprocal lattice space at once, and can detect a peak of even a thin-film sample exhibiting weak diffraction signals.

Even if the dopant elements are included in the n-type metal oxide semiconductor, they do not contribute to generation of carriers when they do not substitute the indium sites and exist as interstitial metals. In addition, the presence of such interstitial metals impedes transportation of carriers, leading to degradation in mobility. As a result of the studies by the present inventors, it has been found that when the peak shape of the absorption edge of the dopant element in XAFS measurement on the n-type metal oxide semiconductor does not match the peak shape of a corresponding zero-valent element but matches the peak shape of a corresponding tetravalent, pentavalent, hexavalent, heptavalent, or octavalent element depending on the kind of the dopant element, a preferable state is achieved where substitutional doping works.

The kind of the dopant element is preferably selected in consideration of, for example, ion radius, coordination number, and orbital energy.

Examples of the dopant include $Ge^{4+}$, $Sn^{4+}$, $Ti^{4+}$, $Zr^{4+}$, $Hf^{4+}$, $V^{5+}$, $Nb^{5+}$, $Ta^{5+}$, $Sb^{5+}$, $Mo^{6+}$, $W^{6+}$, $Re^{7+}$, $Ru^{8+}$, and $Os^{8+}$.

These may be used alone or in combination of two or more.

The dopant concentration may be appropriately selected depending on, for example, kinds of dopants, sites to be substituted, film formation processes, and desired TFT characteristics, but is preferably from 0.01% through 10%, more preferably from 0.01% through 5%, particularly preferably from 0.05% through 2%, in terms of mobility and rising property. Here, "%" means a proportion of moles of the dopant relative to 100% that is the sum of moles of indium and moles of the dopant contained in the n-type metal oxide semiconductor.

Theoretically, the number of electrons generated when a single atom has been substituted is a value obtained by subtracting the valence of indium (i.e., 3) from the valence of a cationic serving as a dopant. In order to generate the same number of electrons with a smaller doping amount, the valence of the dopant ions is preferably larger. Dopants present in a large amount will disturb the crystal structure and the arrangement of atoms, which will cause carrier electrons to be prevented from transporting. It is a preferable embodiment to generate necessary and sufficient carrier electrons with as little doping as possible.

It is also a preferable embodiment to select a dopant having an ion radius close to that of an indium ion. This increases substitution efficiency and can suppress unnecessary dopants, which do not contribute to carrier generation, from deteriorating transistor characteristics.

Since the carrier generation efficiency by doping also depends on various process conditions at the time of TFT fabrication, it is also important to select a process condition that increases the generation efficiency. For example, a desired carrier concentration can be achieved with a smaller amount of doping by appropriately selecting, for example, the temperature of a substrate when the semiconductor layer formed of the n-type metal oxide semiconductor is formed by a sputtering method, the temperature of firing when the semiconductor layer formed of the n-type metal oxide semiconductor is formed by coating and firing a composition, and the temperature of annealing performed after formation of the semiconductor layer formed of the n-type metal oxide semiconductor.

In a substitution-doped n-type metal oxide semiconductor, it is common for carrier electrons derived from oxygen vacancy and carrier electrons derived from substitutional doping to coexist. When it is used as a semiconductor layer, however, it is a more preferable state to reduce oxygen vacancy as much as possible, so that the carrier electrons derived from substitutional doping are responsible for electrical properties. This is because change in the number of carrier electrons in the semiconductor layer directly leads to change in the characteristics of the transistor, and the transistor characteristics can be made more stable by reducing the contribution of the number of electrons derived from oxygen vacancy which are easily changeable. In other words, when the carrier electrons that dominate the semiconductor characteristics of the semiconductor layer are mainly generated by substitutional doping, a highly stable transistor can be obtained.

In order to reduce oxygen vacancies in the semiconductor layer, it is effective to introduce more oxygen into the film during the film-formation process of the semiconductor layer formed of the n-type metal oxide semiconductor. When the semiconductor layer formed of the n-type metal oxide semiconductor is formed by a sputtering method, for example, a film having less oxygen vacancies can be formed by increasing the oxygen concentration in the sputtering atmosphere. Alternatively, when the semiconductor layer formed of the n-type metal oxide semiconductor is formed by coating and firing a composition, a film having less oxygen vacancies can be formed by increasing the oxygen concentration in the atmosphere during firing.

When there are less oxygen vacancies, lattice distortion resulting from the deficiencies will be reduced. As a result, the crystallinity of the indium oxide having a bixbite structure will be increased, and a peak will be detected at an angle corresponding to the (222) plane of indium oxide having a bixbite structure in an X-ray diffraction method using a two-dimensional detector.

When the semiconductor layer formed of the n-type metal oxide semiconductor is formed by a sputtering method, the main factor for controlling oxygen vacancies is the oxygen concentration in the sputtering atmosphere. However, the distance between the sputtering power or the target and the substrate, the shape and arrangement (the shape of a magnetic field) of the magnet of a cathode to which the target is attached, etc. may influence the oxygen vacancies in some degrees.

When the semiconductor layer formed of the n-type metal oxide semiconductor is formed by a coating process, the main factor for controlling oxygen vacancies is the oxygen concentration in the atmosphere during firing. However, the firing temperature, the profile of a temperature gradient, and the annealing conditions (heating after firing), UV irradiation during baking and heating, etc. may influence the oxygen vacancies in some degrees.

Also, the amount of oxygen vacancies can be reduced by adjusting the composition of the n-type metal oxide semiconductor. For example, by introducing a certain amount of a metal element having high affinity for oxygen (e.g., Si, Ge, Zr, Hf, Al, Ga, Sc, Y, Ln (lanthanide), and alkaline earth metals), the occurrence of oxygen vacancies can be suppressed.

When the oxygen vacancies are reduced as much as possible in the above-described manner, the number of carrier electrons in the n-type metal oxide semiconductor can be controlled by the kind of the dopant and the amount of doping, and desired semiconductor characteristics can be achieved by appropriately selecting them.

A formation method of the semiconductor layer is not particularly limited but may be appropriately selected depending on the intended purpose.

Substitutional doping is easily achieved by adding a raw material of the dopant to a raw material of the mother layer for forming the semiconductor layer. For example, when the semiconductor layer is formed by a sputtering method, a target of the mother phase containing a dopant element at a desired concentration may be used. However, when a desired doping amount is small (e.g., 0.2% or less), there is a problem with difficulty in containing such a small amount of atoms at an accurate value and uniformly throughout the target.

From the viewpoint of controllability of the doping amount, it is a more preferable embodiment to form the semiconductor layer by a coating process. In the coating process, a composition for producing an n-type metal oxide semiconductor containing a semiconductor raw material compound, a compound containing a dopant element (a dopant-element-containing compound), and a solvent is coated on a coating target and baked to form a semiconductor layer. A desired doping can be achieved by corresponding a desired doping amount to a ratio of the dopant-element-containing compound in the composition relative to the semiconductor raw material compound. In the composition, it is easy to add the dopant-element-containing compound in such a very small proportion of 0.2% or less as the dopant amount and stir the dopant-element-containing compound uniformly. Thus, the coating process can be said to be more suitable as a formation method of the substitution-doped n-type metal oxide semiconductor.

An average film thickness of the semiconductor layer is not particularly limited and may be appropriately selected depending on the intended purpose, but is preferably from 5 nm through 1 μm, more preferably from 10 nm through 0.5 μm.

<Gate Electrode>

The gate electrode is not particularly limited and may be appropriately selected depending on the intended purpose, so long as the gate electrode is an electrode to which gate voltage is to be applied.

A material of the gate electrode is not particularly limited and may be appropriately selected depending on the intended purpose. Examples of the material include: metals (e.g., Mo, Al, Au, Ag, and Cu) and alloys of these metals; transparent conductive oxides such as ITO and ATO; and organic conductors such as polyethylene dioxythiophene (PEDOT) and polyaniline (PANI).

A formation method of the gate electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average thickness of the gate electrode is not particularly limited and may be appropriately selected depending on the intended purpose. However, the average thickness of the gate electrode is preferably from 20 nm through 1 μm, more preferably from 50 nm through 300 nm.

<Gate Insulating Film>

The gate insulating film is, for example, an insulating film disposed between the gate electrode and the semiconductor layer.

A material of the gate insulating film is not particularly limited and may be appropriately selected depending on the intended purpose. Examples of the material include materials that have been already used for mass production (e.g., $SiO_2$, SiON, and SiNx), high-dielectric-constant materials (e.g., $La_2O_3$, $ZrO_2$, and $HfO_2$), and organic materials (e.g., polyimide (PI) and fluororesins).

A formation method of the gate insulating film is not particularly limited and may be appropriately selected depending on the intended purpose. Examples of the formation method include vacuum film formation processes (e.g., sputtering, chemical vapor deposition (CVD), and atomic layer deposition (ALD)) and printing methods (e.g., spin coating, die coating, and inkjet printing).

An average thickness of the gate insulating film is not particularly limited and may be appropriately selected depending on the intended purpose. However, the average thickness of the gate insulating film is preferably from 50 nm through 3 μm, more preferably from 100 nm through 1 μm.

<Source Electrode and Drain Electrode>

The source electrode and the drain electrode are electrodes configured to take electric current out.

A material of the source electrode and the drain electrode is not particularly limited and may be appropriately selected depending on the intended purpose. Examples of the material include: metals (e.g., Mo, Al, Au, Ag, and Cu) and alloys of these metals; transparent conductive oxides such as ITO and ATO; and organic conductors such as polyethylene dioxythiophene (PEDOT) and polyaniline (PANI).

A formation method of the source electrode and the drain electrode is not particularly limited and may be appropriately selected depending on the intended purpose. Examples of the formation method include: (i) a method of forming a film through sputtering or dip coating and patterning the film through photolithography; and (ii) a method of directly forming a film having a desired shape through a printing process, such as inkjet printing, nanoimprinting, or gravure printing.

An average thickness of the source electrode and the drain electrode is not particularly limited and may be appropriately selected depending on the intended purpose. However, the average thickness of the gate electrode is preferably from 20 nm through 1 rpm, more preferably from 50 nm through 300 nm.

<Insulating Layer>

A structure where the insulating layer is disposed on at least one of the source electrode, the drain electrode, and the semiconductor layer is also a preferable embodiment of the field-effect transistor having stable characteristics. In many cases, the insulating layer plays a role of a so-called passivation layer that prevents the source electrode, the drain electrode, and the semiconductor layer from changing in characteristics by being directly exposed to oxygen or moisture in the atmosphere. In a display device using the field-effect transistor, a display element including a light-emitting layer may be disposed on or above the transistor. In this case, the insulating layer may also function as a so-called leveling film that absorbs level differences corresponding to a shape of the transistor to level the surface.

A material of the insulating layer is not particularly limited and may be appropriately selected depending on the intended purpose. Examples of the material include materials that have already been widely used for mass production (e.g., $SiO_2$, SiON, and SiNx) and organic materials (e.g., polyimide (PI) and fluororesins).

Figure 2:
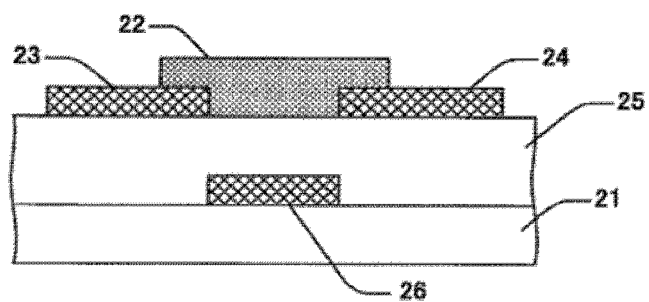
FIG. 2 is a schematic view of one example of a bottom contact/bottom gate field-effect transistor.
Figure 3:
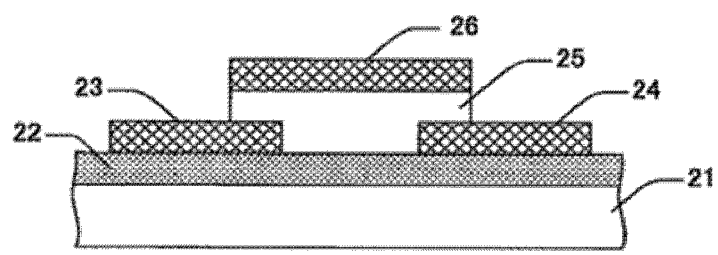
FIG. 3 is a schematic view of one example of a top contact/top gate field-effect transistor.
Figure 4:
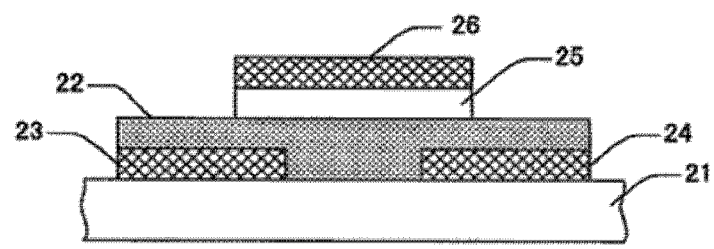
FIG. 4 is a schematic view of one example of a bottom contact/top gate field-effect transistor.

A structure of the field-effect transistor is not particularly limited and may be appropriately selected depending on the intended purpose. Examples of the structure of the field-effect transistor include a top contact/bottom gate field-effect transistor (FIG. 1), a bottom contact/bottom gate field-effect transistor (FIG. 2), a top contact/top gate field-effect transistor (FIG. 3), and a bottom contact/top gate field-effect transistor (FIG. 4).

In FIGS. 1 to 4, reference numeral 21 denotes a substrate, reference numeral 22 denotes a semiconductor layer, reference numeral 23 denotes a source electrode, reference numeral 24 denotes a drain electrode, reference numeral 25 denotes a gate insulating film, and reference numeral 26 denotes a gate electrode.

The field-effect transistor can suitably be used for display elements, but use of the field-effect transistor is not limited to display elements. For example, the field-effect transistor can be used for IC cards and ID tags.

<Production Method of Field-Effect Transistor>

One example of the method for producing the field-effect transistor will be described.

First, a gate electrode is formed on a substrate.

A shape, a structure, and a size of the substrate are not particularly limited and may be appropriately selected depending on the intended purpose.

A material of the substrate is not particularly limited and may be appropriately selected depending on the intended purpose. Examples of the material include glass and plastics.

The glass is not particularly limited and may be appropriately selected depending on the intended purpose. Examples of the glass include non-alkali glass and silica glass.

The plastics are not particularly limited and may be appropriately selected depending on the intended purpose. Examples of the plastics include polycarbonate (PC), polyimide (PI), polyethylene terephthalate (PET), and polyethylene naphthalate (PEN).

Note that, pre-treatments, such as oxygen plasma, UV ozone, and UV radiation washing, are preferably performed on the substrate to clean a surface of the substrate and improve adhesiveness.

Subsequently, a gate insulating film is formed on the gate electrode.

Subsequently, a semiconductor layer of an n-type oxide semiconductor is formed in a channel region and on the gate insulating film.

Subsequently, a source electrode and a drain electrode are formed on the gate insulating film to be spaced from each other so as to be across the semiconductor layer.

In the above-described manner, the field-effect transistor is produced. According to the above-described production method, for example, a top contact/bottom gate field-effect transistor as illustrated in FIG. 1 is produced.

(Display Element)

A display element of the present invention includes at least a light control element and a driving circuit configured to drive the light control element. The display element further includes other components according to the necessity.

<Light Control Element>

The light control element is not particularly limited and may be appropriately selected depending on the intended purpose, so long as the light control element is an element configured to control a light output according to a driving signal. Examples of the light control element include electroluminescent (EL) elements, electrochromic (EC) elements, liquid crystal elements, electrophoretic elements, and electrowetting elements.

<Driving Circuit>

The driving circuit is not particularly limited and may be appropriately selected depending on the intended purpose, so long as the driving circuit includes the field-effect transistor of the present invention.

<Other Components>

The other components are not particularly limited and may be appropriately selected depending on the intended purpose.

The display element includes the field-effect transistor of the present invention. Therefore, the display element achieves high-speed driving and a long service life, and can reduce variation within elements. Moreover, the driving transistor can be operated at a constant gate voltage even when the display element has changed in performances over time.

(Image Display Device)

An image display device of the present invention includes at least a plurality of display elements, a plurality of wired lines, and a display control device. The image display device further includes other components according to the necessity.

<Display Elements>

The plurality of display elements are not particularly limited and may be appropriately selected depending on the intended purpose, so long as the plurality of display elements are the display elements of the present invention arranged in a form of matrix.

<Wired Lines>

The plurality of wired lines are not particularly limited and may be appropriately selected depending on the intended purpose, so long as the plurality of wired lines are wired lines configured to individually apply gate voltage and signal voltage to the field-effect transistors in the plurality of display elements.

<Display Control Device>

The display control device is not particularly limited and may be appropriately selected depending on the intended purpose, so long as the display control device is a device configured to individually control the gate voltage and the signal voltage of the field-effect transistors via the plurality of wired lines according to the image data.

<Other Components>

The other components are not particularly limited and may be appropriately selected depending on the intended purpose.

Variation between the elements can be suppressed and high-quality images can be displayed with a large display because the image display device includes the display elements of the present invention.

(System)

A system of the present invention includes at least the image display device of the present invention and an image-data-generating device.

The image-data-generating device is configured to generate image data based on image information to be displayed and to output the image data to the image display device.

Image information can be displayed with high definition because the system includes the image display device of the present invention.

The display element, the image display device, and the system of the present invention are described below with reference to the drawings.

Figure 5:
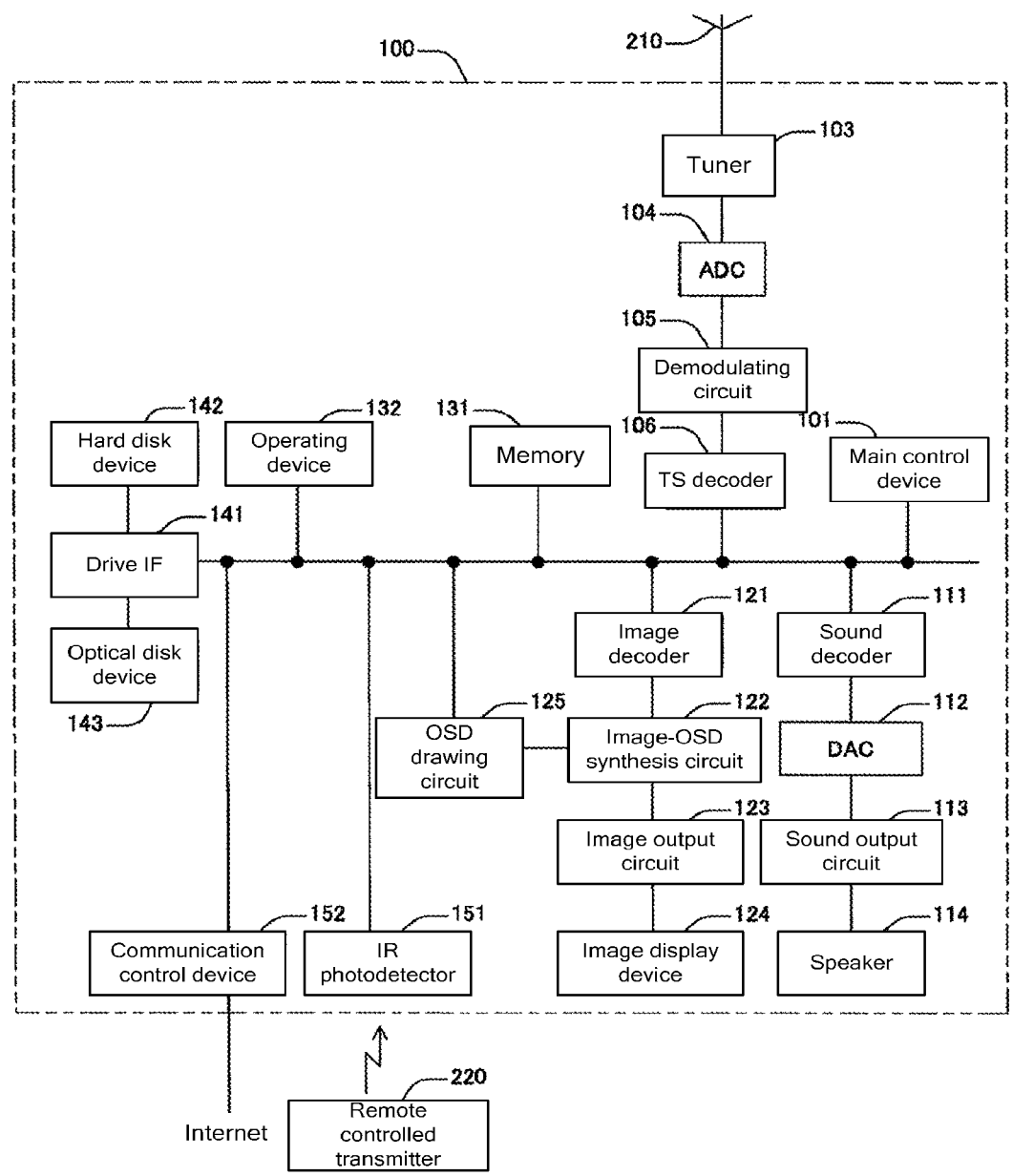
FIG. 5 is a schematic structural diagram of one example of a television device as a system of the present disclosure.

First, a television device is described as the system of the present invention with reference to FIG. 5. Note that, the structure illustrated in FIG. 5 is one example, and a structure of the television device as the system of the present invention is not limited to the structure illustrated in FIG. 5.

In FIG. 5, a television device 100 includes a main control device 101, a tuner 103, an AD converter (ADC) 104, a demodulating circuit 105, a transport stream (TS) decoder 106, a sound decoder 111, a DA converter (DAC) 112, a sound output circuit 113, a speaker 114, an image decoder 121, an image-OSD synthesis circuit 122, an image output circuit 123, an image display device 124, an OSD drawing circuit 125, a memory 131, an operating device 132, a drive interface (drive IF) 141, a hard disk device 142, an optical disk device 143, an IR photodetector 151, and a communication control unit 152.

The image decoder 121, the image-OSD synthesis circuit 122, the image output circuit 123, and the OSD drawing circuit 125 constitute the image-data-generating device.

The main control device 101 includes a CPU, a flash ROM, and a RAM. The main control device 101 is configured to control the entirety of the television device 100.

The flash ROM stores, for example: a program written with a code that can be decoded with the CPU; and various data used in processing with the CPU.

Also, the RAM is a memory for operation.

The tuner 103 is configured to select a pre-set channel from the broadcast waves received by an antenna 210.

The ADC 104 is configured to convert the output signal (analog information) of the tuner 103 into digital information.

The demodulating circuit 105 is configured to demodulate the digital information from the ADC 104.

The TS decoder 106 is configured to TS decode the output signal of the demodulating circuit 105 to separate the output signal into sound information and image information.

The sound decoder 111 is configured to decode the sound information from the TS decoder 106.

The DA converter (DAC) 112 is configured to convert the output signal of the sound decoder 111 into an analog signal.

The sound output circuit 113 is configured to output the output signal of the DA converter (DAC) 112 to the speaker 114.

The image decoder 121 is configured to decode the image information from the TS decoder 106.

The image-OSD synthesis circuit 122 is configured to synthesize an output signal of the image decoder 121 and an output signal of the OSD drawing circuit 125.

The image output circuit 123 is configured to output the output signal of the image-OSD synthesis circuit 122 to the image display device 124.

The OSD drawing circuit 125 includes a character generator configured to display characters or graphics on a screen of the image display device 124. The OSD drawing circuit 125 is configured to generate a signal including display information according to the instructions from the operating device 132 and the IR photodetector 151.

The memory 131 is configured to temporarily store audio-visual (AV) data.

The operating device 132 includes an input medium (not illustrated) such as a control panel. The operating device 132 is configured to inform various information, which has been input by a user, to the main control device 101.

The drive IF 141 is an interactive communication interface. One example of the drive IF 141 is according to AT attachment packet interface (ATAPI).

The hard disk device 142 includes, for example, a hard disk and a driving device configured to drive the hard disk. The driving device is configured to record data on the hard disk and reproduce the data recorded on the hard disk.

The optical disk device 143 is configured to record data on an optical disk (e.g., a DVD) and reproduce the data recorded on the optical disk.

The IR photodetector 151 is configured to receive a photosignal from a remote-controlled transmitter 220 and report the received photosignal to the main control device 101.

The communication control unit 152 is configured to control communication with the Internet. Various kinds of information can be obtained via the Internet.

Figure 6:
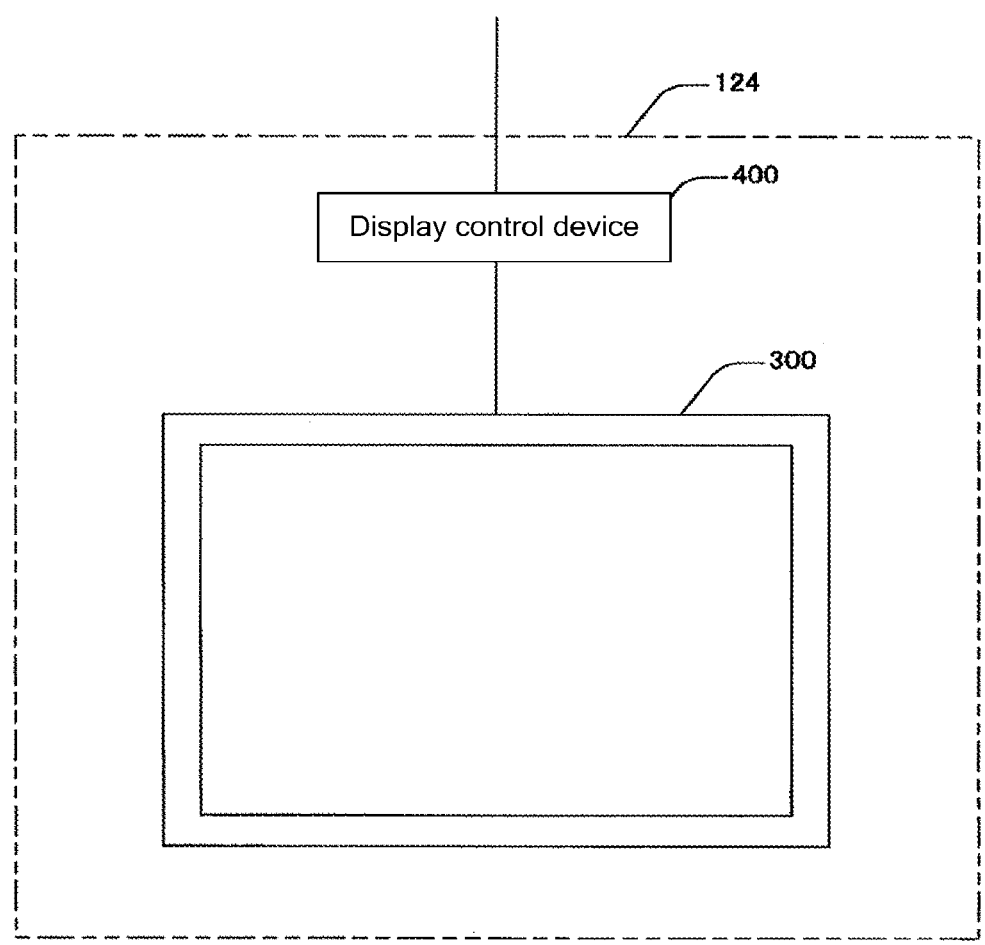
FIG. 6 is an explanatory diagram of an image display device in FIG. 5 (part 1)

FIG. 6 is a schematic structural view illustrating one example of the image display device of the present invention.

In FIG. 6, the image display device 124 includes a display unit 300 and a display control device 400.

Figure 7:
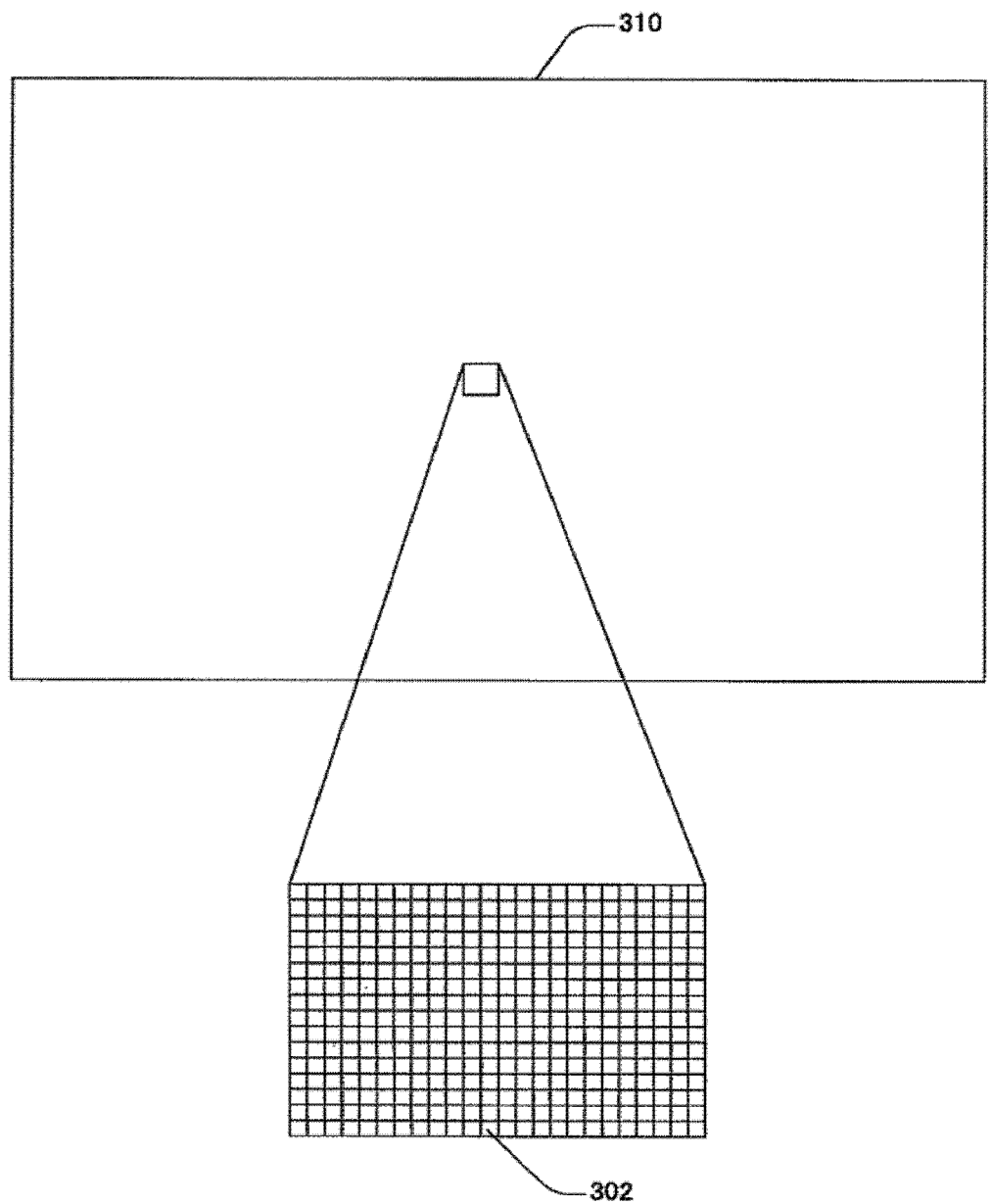
FIG. 7 is an explanatory diagram of an image display device in FIG. 5 (part 2)

As illustrated in FIG. 7, the display unit 300 includes a display 310 in which a plurality of display elements 302 are arranged in a form of matrix (the number "n"×the number "m" in FIG. 7).

Figure 8:
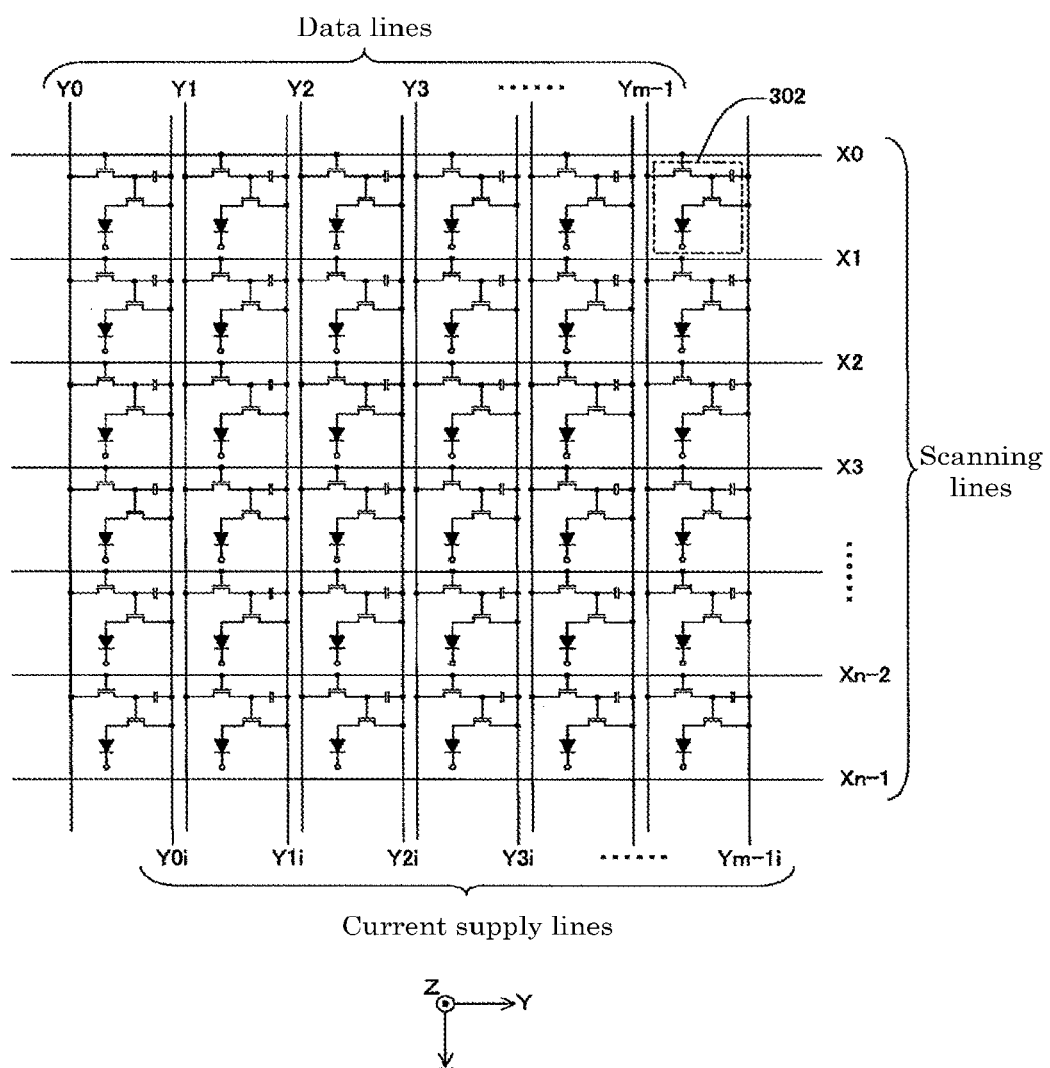
FIG. 8 is an explanatory diagram of an image display device in FIG. 5 (part 3)

As illustrated in FIG. 8, the display 310 includes "n" scanning lines (X0, X1, X2, X3, . . . Xn−2, Xn−1) arranged along the X axis direction at constant intervals, "m" data lines (Y0, Y1, Y2, Y3, . . . Ym−1) arranged along the Y axis direction at constant intervals, and "m" current supply lines (Y0i, Y1i, Y2i, Y3i, . . . Ym−1i) arranged along the Y axis direction at constant intervals.

Each of the display elements can be identified by each of the scanning lines and each of the data lines.

The display element of the present invention will be described below with reference to FIG. 9.

Figure 9:
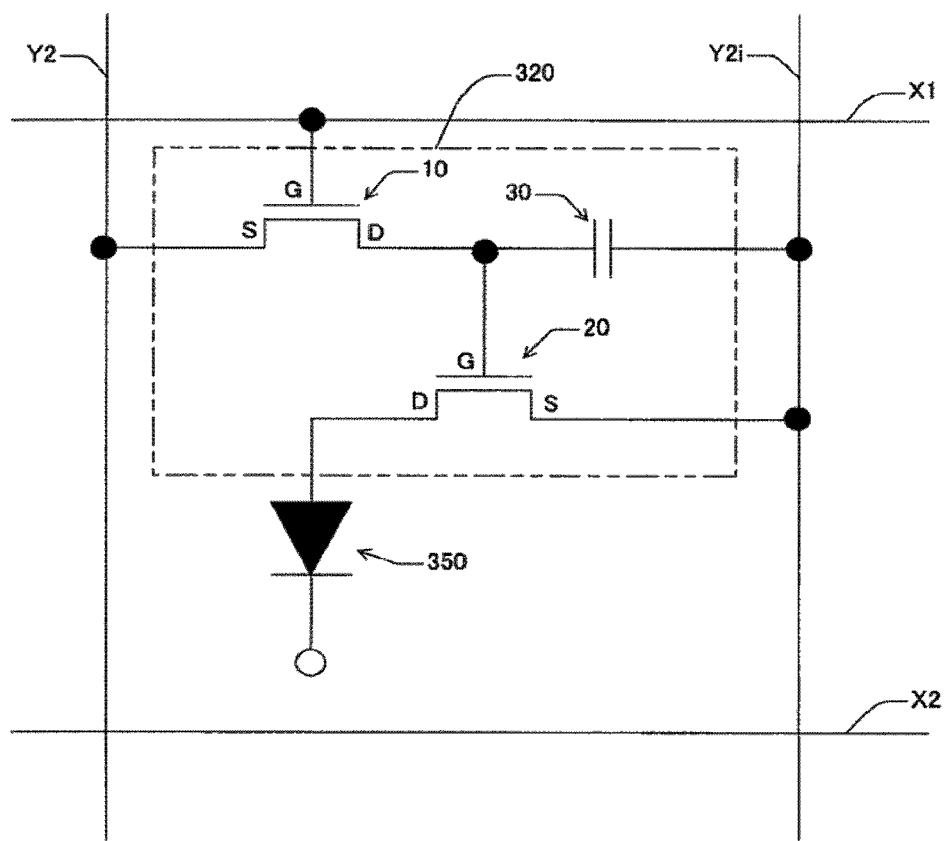
FIG. 9 is an explanatory diagram of one example of a display element of the present disclosure.

FIG. 9 is a schematic structural view illustrating one example of the display element of the present invention.

As illustrated as one example in FIG. 9, the display element includes an organic electroluminescent (EL) element 350 and a drive circuit 320 configured to allow the organic EL element 350 to emit light. The drive circuit 320 is a current-driven basic circuit of 2Tr-1C, but the drive circuit 320 is not limited to the above-described circuit. Specifically, the display 310 is an organic EL display of a so-called active matrix system.

Figure 10:
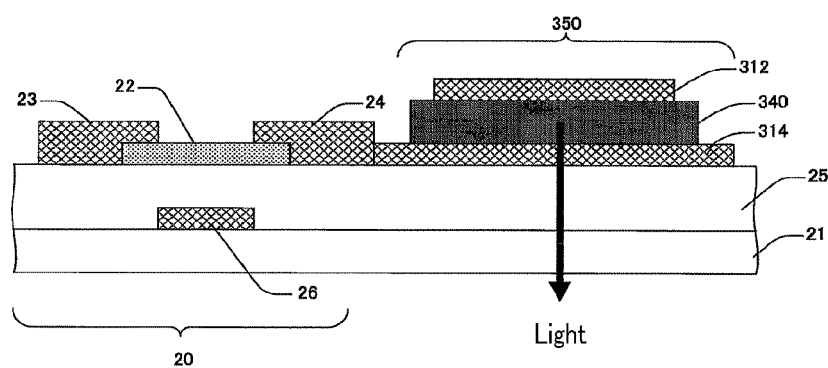
FIG. 10 is a schematic structural view of one example of a positional relationship between an organic EL element and a field-effect transistor in a display element.

One example of a positional relationship between an organic EL element 350 and a field-effect transistor 20 serving as a drive circuit in a display element 302 is illustrated in FIG. 10. In FIG. 10, the organic EL element 350 is disposed next to the field-effect transistor 20. Note that, a field-effect transistor 10 and a capacitor (not illustrated) are also formed on the same substrate.

A passivation film is suitably disposed on or above the semiconductor layer 22, although the passivation film is not illustrated in FIG. 10. A material of the passivation film may be appropriately selected from $SiO_2$, SiON, $SiN_x$, $Al_2O_3$, and fluoropolymers. In this figure, reference numeral 21 denotes a substrate, reference numeral 23 denotes a source electrode, reference numeral 24 denotes a drain electrode, reference numeral 25 denotes a gate insulating film, and reference numeral 26 denotes a gate electrode.

Figure 11:
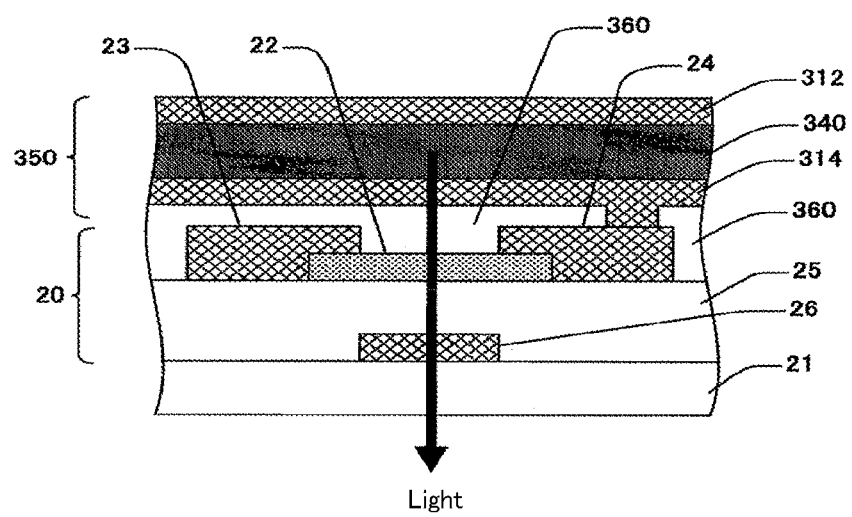
FIG. 11 is a schematic structural view of another example of a positional relationship between an organic EL element and a field-effect transistor in a display element.

As illustrated in FIG. 11, for example, the organic EL element 350 may be disposed on the field-effect transistor 20. In the case of this structure, the gate electrode 26 is required to have transparency. Therefore, a conductive transparent oxide, such as ITO, $In_2O_3$, $SnO_2$, ZnO, Ga-added ZnO, Al-added ZnO, and Sb-added $SnO_2$, is used for the gate electrode 26. Note that, reference numeral 360 is an interlayer insulating film (a leveling film). Polyimide or acrylic resins can be used for the interlayer insulating film.

Figure 12:
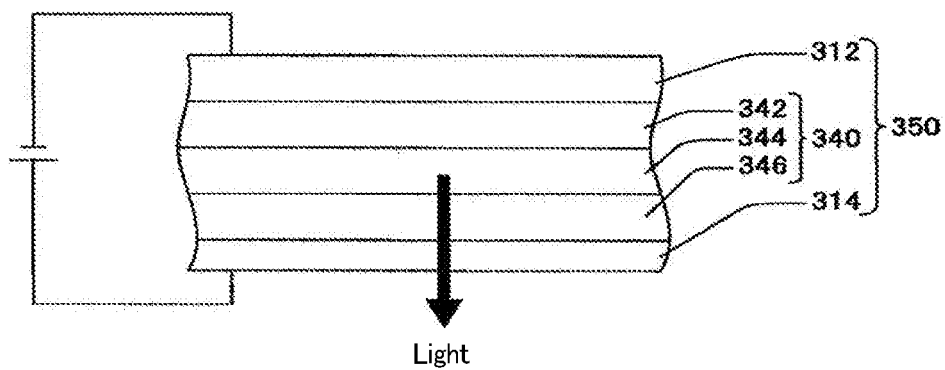
FIG. 12 is a schematic structural view of one example of an organic EL element.

FIG. 12 is a schematic structural view illustrating one example of an organic EL element.

In FIG. 12, the organic EL element 350 includes a cathode 312, an anode 314, and an organic EL thin film layer 340.

A material of the cathode 312 is not particularly limited and may be appropriately selected depending on the intended purpose. Examples of the material include aluminium (Al), magnesium (Mg)-silver (Ag) alloy, aluminium (Al)-lithium (Li) alloy, and indium tin oxide (ITO). Note that, the magnesium (Mg)-silver (Ag) alloy becomes a high-reflective electrode if having a sufficient thickness, and an extremely thin film (less than about nm) of the Mg—Ag alloy becomes a semi-transparent electrode. In FIG. 12, light is taken out from the side of the anode, but light can be taken out from the side of the cathode by making the cathode as a transparent or semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in a case where a silver alloy is used, the resultant electrode becomes a high-reflective electrode, which is suitable for taking light out from the side of the cathode.

The organic EL thin film layer 340 includes an electron transporting layer 342, a light emitting layer 344, and a hole transporting layer 346. The electron transporting layer 342 is coupled to a cathode 312 and the hole transporting layer 346 is coupled to an anode 314. The light emitting layer 344 emits light when a predetermined voltage is applied between the anode 314 and the cathode 312.

The electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described organic EL element is a so-called "bottom emission" organic EL element, in which light is taken out from the side of the substrate. However, the organic EL element may be a "top emission" organic EL element, in which light is taken out from the opposite side to the substrate.

The driving circuit 320 in FIG. 9 will be described.

The drive circuit 320 includes two field-effect transistors 10 and 20 and a capacitor 30.

The field-effect transistor 10 operates as a switching element. A gate electrode G of the field-effect transistor 10 is coupled to a predetermined scanning line and a source electrode S of the field-effect transistor 10 is coupled to a predetermined data line. Moreover, a drain electrode D of the field-effect transistor 10 is coupled to one terminal of the capacitor 30.

The field-effect transistor 20 is configured to supply electric current to the organic EL element 350. The gate electrode G of the field-effect transistor 20 is coupled to the drain electrode D of the field-effect transistor 10. The drain electrode of the field-effect transistor is coupled to the anode 314 of the organic EL element 350 and a source electrode S of the field-effect transistor 20 is coupled to a predetermined current supply line.

The capacitor 30 is configured to memorize the state of the field-effect transistor 10; i.e., data. The other terminal of the capacitor 30 is coupled to a predetermined current supply line.

When the field-effect transistor 10 turns into the state of "On", image data are stored in the capacitor 30 via the signal line Y2. Even after turning the field-effect transistor 10 into the state of "Off", the organic EL element 350 is driven by maintaining the "On" state of the field-effect transistor 20 corresponding to the image data.

Figure 13:
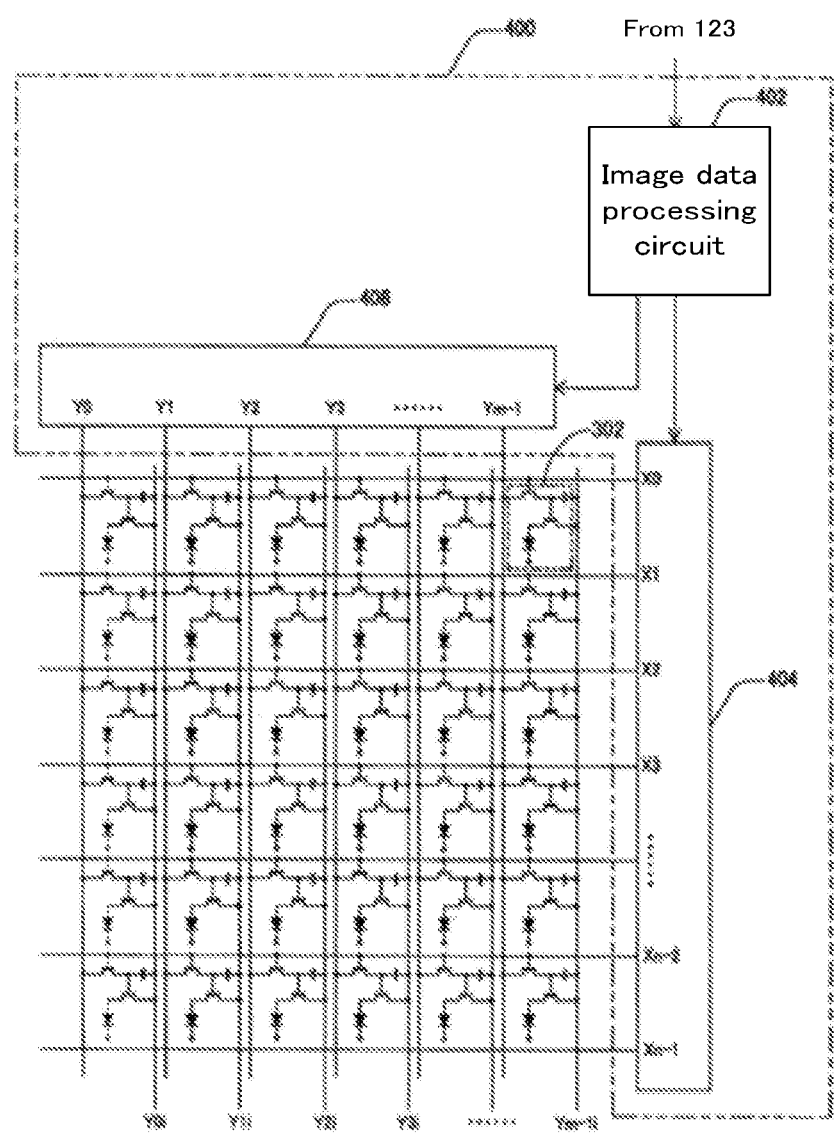
FIG. 13 is an explanatory diagram of a display control device.

FIG. 13 is a schematic structural view illustrating another example of the image display device of the present invention.

In FIG. 13, the image display device includes display elements 302, wired lines (including scanning lines, data lines, and current supply lines), and a display control device 400.

The display control device 400 includes an image-data-processing circuit 402, a scanning-line-driving circuit 404, and a data-line-driving circuit 406.

The image-data-processing circuit 402 determines brightness of a plurality of display elements 302 in the display based on output signals of an image output circuit 123.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

The above embodiment refers to a case where the light control element is an organic EL element, but is not limitative. For example, the light control element may be an electrochromic element. In this case, the display is an electrochromic display.

Figure 14:
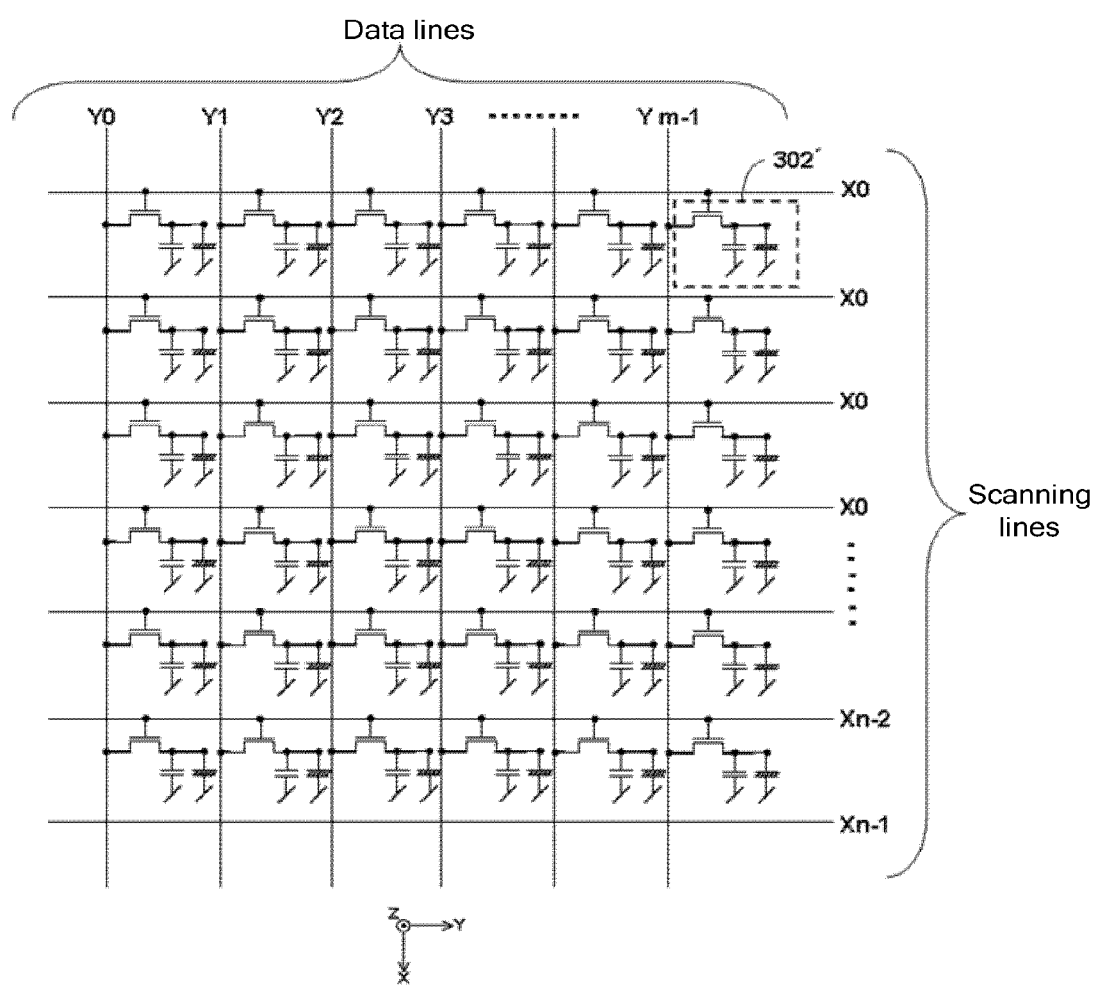
FIG. 14 is an explanatory diagram of a liquid crystal display.
Figure 15:
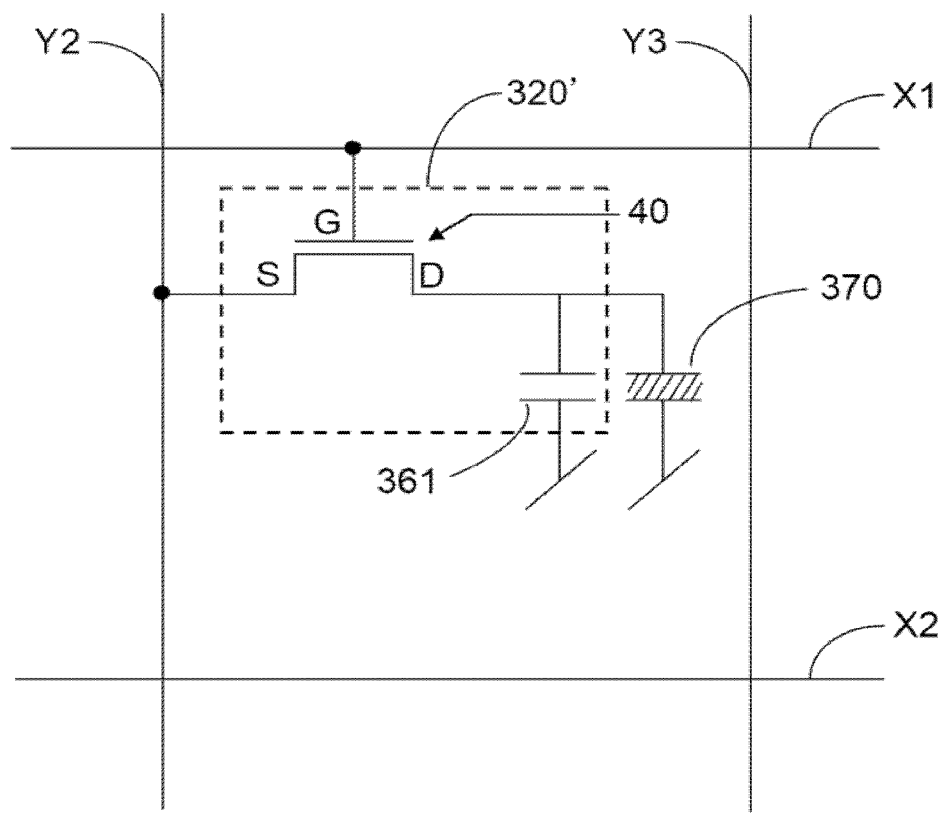
FIG. 15 is an explanatory diagram of a display element in FIG. 14.

The light control element may be a liquid crystal element. In this case, the display is a liquid crystal display. As illustrated in FIG. 14, it is not necessary to provide a current supply line for a display element 302'. As illustrated in FIG. 15, the drive circuit 320' may be produced with one field-effect transistor 40, which is similar to each of the field-effect transistors 10 and 20. In the field-effect transistor 40, a gate electrode G is coupled to a predetermined scanning line and a source electrode S is coupled to a predetermined data line. Moreover, a drain electrode D is coupled to a capacitor 361 and a pixel electrode of a liquid crystal element 370.

The light control element may be an electrophoretic element, an inorganic EL element, or an electrowetting element.

Although a case where the system of the present invention is a television device has been described above, the system of the present invention is not limited to the television device. The system is not particularly limited so long as the system includes the image display device 124 as a device for displaying images and information. For example, the system may be a computer system in which a computer (including a personal computer) is coupled to the image display device 124.

The image display device 124 can be used as a display unit in mobile information devices (e.g., mobile phones, portable music players, portable video players, electronic books, personal digital assistants (PDAs)) and camera devices (e.g., still cameras and video cameras). The image display device 124 can also be used for display units for various information in transportation systems (e.g., cars, aircraft, trains, and ships). Furthermore, the image display device 124 can be used for display units for various information in measuring devices, analysis devices, medical equipment, and advertising media.

EXAMPLES

The present invention will next be described by way of Examples, but the Examples should not be construed to limit the present invention in any way.

Example 1

<Production of Field-Effect Transistor>
—Formation of Gate Electrode—
Al was vapor-deposited on a glass substrate so as to have a thickness of 100 nm and the resultant Al film was subjected to patterning into lines by photolithography and etching, to form a gate electrode.
—Formation of Gate Insulating Film—
Next, a film of SiON having a thickness of 200 nm was formed through plasma CVD using $SiH_4$ gas and $N_2O$ gas as raw materials at a temperature of 200° C. The resultant film was used as a gate insulating film.
—Formation of Semiconductor Layer—
A film of $In_2O_3$ doped with Sn was formed on the gate insulating film through RF magnetron sputtering so as to have a film thickness of 20 nm. The target used was a polycrystalline sintered body having a composition of $In_{1.96}Sn_{0.04}O_3$. Argon gas and oxygen gas were introduced as sputtering gas. The total pressure was fixed to 1.1 Pa and the oxygen concentration was set to 50% by volume. Patterning was performed through film formation via a metal mask. In the obtained semiconductor layer, Sn was introduced through substitutional doping at a concentration of 2 mol % relative to In in the $In_2O_3$. Subsequently, annealing was performed in the atmosphere at 300° C. for 1 hour using an oven. The annealing is a treatment typically performed for the purpose of reducing level density of interfacial defects between a semiconductor layer and a gate insulating film to improve transistor characteristics.
—Formation of Source Electrode and Drain Electrode—
A source electrode and a drain electrode each having a thickness of 100 nm were formed on the gate insulating film and the semiconductor layer through vacuum vapor deposition. The vapor deposition source used was Al. Patterning was performed through film formation via a metal mask so as to have a channel width of 400 μm and a channel length of 50 rpm.

Figure 16:
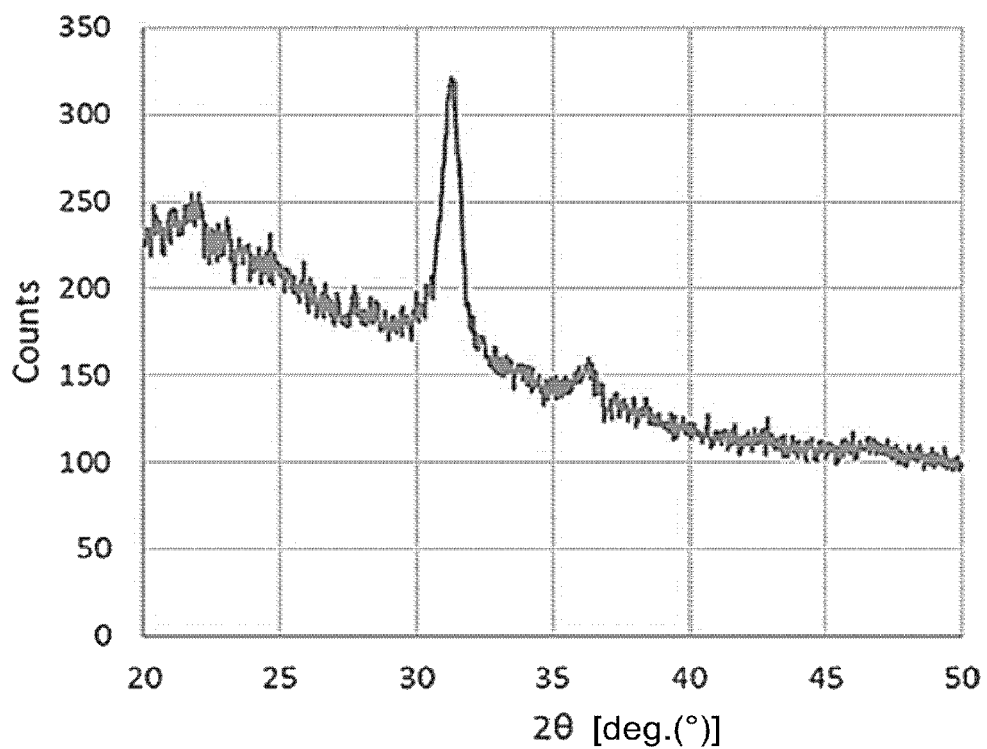
FIG. 16 is a graph presenting measurement results obtained by an X-ray diffraction method using a two-dimensional detector.

A top contact/bottom gate field-effect transistor similar to the field-effect transistor illustrated in FIG. 1 was obtained by the process described above.
<Analysis of Oxide Semiconductor>
X-ray diffraction measurement was performed on a film of an n-type metal oxide semiconductor formed on a glass substrate under the same sputtering conditions as in the semiconductor layer described above, using Discover 8 (available from Bruker Co.) equipped with a two-dimensional detector. The light incident angle was 3 degrees and the detector angle was 25 degrees. The measurement results are presented in FIG. 16. FIG. 16 is a graph of the values obtained by integrating the obtained two-dimensional data in the 2θ direction. The strongest peak was observed at 2θ of around 31 degrees. This peak corresponds to the (222) peak of a bixbite-type crystal structure of $In_2O_3$.

Figure 17:
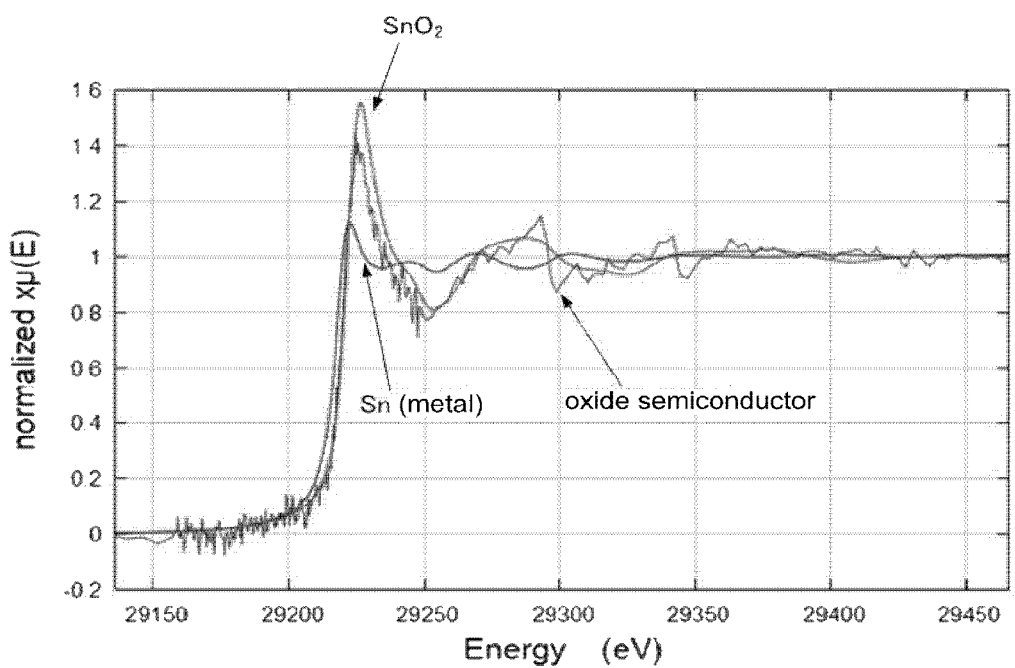
FIG. 17 is graph presenting results of XAFS measurement.

XAFS measurement was performed on a film of an n-type metal oxide semiconductor formed on a glass substrate under the same sputtering conditions as in the semiconductor layer. The measurement results of the K absorption edge of Sn, the dopant, are presented in FIG. 17. For comparison, the measurement results of metal Sn (zero-valent) and Sn (tetravalent) in an oxide ($SnO_2$) are also presented in FIG. 17. For tetravalent Sn, rising of the K absorption edge is found to shift by 3 eV to the high energy side as compared to the case of the metal Sn (zero-valent). The measurement result of Sn in the n-type metal oxide semiconductor is in agreement with the result of the tetravalent Sn.

<Evaluation of Transistor Performances>

The obtained field-effect transistor was evaluated for transistor performances using a semiconductor parameter analyzer (semiconductor parameter analyzer 4156C, available from Agilent Technologies). Electric current (Ids) between the source electrode and the drain electrode was measured with voltage (Vds) between the source electrode and the drain electrode being 20 V and with varying gate voltage (Vg) from −20 V through +20 V to evaluate transfer characteristics (Vg-Ids characteristics). The field-effect mobility in the saturation region was calculated as a high value of 20.2 $cm^2/Vs$.

When the semiconductor layer is formed through sputtering, oxygen is allowed to flow in a larger volume of 50% by volume, and thus it is considered that the amount of oxygen vacancies in the semiconductor layer is sufficiently small. The substitutional doping efficiently worked to generate sufficient amount of carriers, whereby good transistor characteristics were achieved. The semiconductor layer has crystallinity, and the dopant Sn contributes to generation of the carriers by substituting the indium sites in a tetravalent state.

Aspects of the present invention are, for example, as follows.

<1> A field-effect transistor including
a semiconductor layer formed of an n-type metal oxide semiconductor,
wherein the n-type metal oxide semiconductor includes indium oxide,
wherein the indium oxide is n-type doped through introduction of one or more kinds of cations as dopants, and
wherein the n-type metal oxide semiconductor has a peak detected at an angle corresponding to a (222) plane of indium oxide having a bixbite structure in an X-ray diffraction method using a two-dimensional detector.

<2> The field-effect transistor according to <1>,
wherein a peak shape of an absorption edge of an element of the dopant in XAFS measurement on the n-type metal oxide semiconductor matches a peak shape of a tetravalent, pentavalent, hexavalent, heptavalent, or octavalent element of the element.

<3> The field-effect transistor according to <1> or <2>,
wherein a proportion of moles of the dopant in the n-type metal oxide semiconductor is from 0.01% through 10% relative to 100% that is a sum of moles of indium and moles of the dopant contained in the n-type metal oxide semiconductor.

<4> The field-effect transistor according to any one of <1> to <3>,
wherein the n-type metal oxide semiconductor further includes at least one selected from the group consisting of Si, Ge, Zr, Hf, Al, Ga, Sc, Y, Ln (lanthanide), and alkaline earth metals.

<5> A display element including:
a light control element configured to control light output according to a driving signal; and
a driving circuit including the field-effect transistor according to any one of <1> to <4> and configured to drive the light control element.

<6> The display element according to <5>,
wherein the light control element includes an electroluminescent element, an electrochromic element, a liquid crystal element, an electrophoretic element, or an electrowetting element.

<7> An image display device configured to display an image corresponding to image data, the image display device including:
a plurality of display elements arranged in a form of matrix, each of the plurality of display elements being the display element according to <5> or <6>;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines according to the image data.

<8> A system including:
the image display device according to <7>; and
an image-data-generating device configured to generate image data based on image information to be displayed and to output the image data to the image display device.

What is claimed is:

1. A field-effect transistor comprising
a semiconductor layer formed of an n-type metal oxide semiconductor,
wherein the n-type metal oxide semiconductor includes indium oxide,
wherein the indium oxide is n-type doped through introduction of one or more kinds of cations as dopants, and
wherein the n-type metal oxide semiconductor has a peak detected at an angle corresponding to a (222) plane of indium oxide having a bixbyite structure in an X-ray diffraction method using a two-dimensional detector, and
wherein a film thickness of the semiconductor layer is 30 nm or less.

2. The field-effect transistor according to claim 1,
wherein a peak shape of an absorption edge of an element of the dopant in XAFS measurement on the n-type metal oxide semiconductor matches a peak shape of a tetravalent, pentavalent, hexavalent, heptavalent, or octavalent element of the element.

3. The field-effect transistor according to claim 1,
wherein a proportion of moles of the dopant in the n-type metal oxide semiconductor is from 0.01% through 10% relative to 100% that is a sum of moles of indium and moles of the dopant contained in the n-type metal oxide semiconductor.

4. The field-effect transistor according to claim 1,
wherein the n-type metal oxide semiconductor further includes at least one selected from the group consisting of Si, Ge, Zr, Hf, Al, Ga, Sc, Y, Ln (lanthanide), and alkaline earth metals.

5. A display element comprising:
a light control element configured to control light output according to a driving signal; and
a driving circuit including the field-effect transistor according to claim 1 and configured to drive the light control element.

6. The display element according to claim 5,
wherein the light control element includes an electroluminescent element, an electrochromic element, a liquid crystal element, an electrophoretic element, or an electrowetting element.

7. An image display device configured to display an image corresponding to image data, the image display device including:
- a plurality of display elements arranged in a form of matrix, each of the plurality of display elements being the display element according to claim 5;
- a plurality of wired lines configured to individually apply gate voltage and signal voltage to the field-effect transistors in the plurality of display elements; and
- a display control device configured to individually control the gate voltage and the signal voltage of the field-effect transistors via the plurality of wired lines according to the image data.

8. A system comprising:
the image display device according to claim 7; and
an image-data-generating device configured to generate image data based on image information to be displayed and to output the image data to the image display device.

* * * * *